United States Patent
Ahn et al.

(10) Patent No.: US 7,161,660 B2
(45) Date of Patent: Jan. 9, 2007

(54) PHOTOLITHOGRAPHY SYSTEM AND METHOD OF MONITORING THE SAME

(75) Inventors: Yo-Han Ahn, Yongin-si (KR);
Seok-Ryeul Lee, Hwasung-si (KR);
Jung-Sung Hwang, Suwon-si (KR);
Tae-Jin Hwang, Yongin-si (KR);
Byung-Moo Lee, Hwasung-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 114 days.

(21) Appl. No.: 11/017,783

(22) Filed: Dec. 22, 2004

(65) Prior Publication Data

US 2005/0134823 A1    Jun. 23, 2005

(30) Foreign Application Priority Data

Dec. 22, 2003   (KR) .................... 10-2003-0094844

(51) Int. Cl.
*G03B 27/72*   (2006.01)
(52) U.S. Cl. .............................. 355/68; 355/69; 355/77
(58) Field of Classification Search .................... None
See application file for complete search history.

(56) References Cited

U.S. PATENT DOCUMENTS 6,538,719 B1   3/2003   Takahashi et al.

FOREIGN PATENT DOCUMENTS

| EP | 0 458 539 A2 | 11/1991 |
|---|---|---|
| JP | 5326359 | 12/1993 |
| JP | 06-084869 | 3/1994 |
| JP | 2002-353109 | 12/2002 |
| KR | 10-0190026 | 1/1999 |

*Primary Examiner*—D. Rutledge
(74) *Attorney, Agent, or Firm*—Volentine Francos & Whitt, PLLC

(57) ABSTRACT

A management system and method of a reticle in an exposing process are disclosed. A calculator calculates an accumulated dosage of an illuminating light irradiated onto a reticle used in a photolithography process. The calculator is connected to an exposing apparatus to expose photoresist on a semiconductor substrate. A comparator compares the calculated accumulated dosage with a preset reference dosage. When the calculated accumulated dosage is greater than or equal to the reference dosage, a controller suspends the photolithography process. Minimizing haze contamination on the reticle, thus preventing process failures.

15 Claims, 5 Drawing Sheets

PHOTOLITHOGRAPHY SYSTEM AND METHOD OF MONITORING THE SAME

BACKGROUND OF THE INVENTION

1. Field of the Invention

The present invention generally relates to a photolithography system and a method of monitoring the same. More particularly, the present invention relates to a method and a system for efficiently monitoring and managing a reticle used to form photoresist patterns on a wafer during an exposing process.

A claim of priority is made to Korean Patent Application No. 2003-94844, filed on Dec. 22, 2003, the contents of which are herein incorporated by reference.

2. Description of the Related Art

Generally, a semiconductor device is manufactured by a fabrication (FAB) process to produce electronic circuits on a silicon wafer, an electrical die sorting (EDS) process to inspect electrical characteristics of the electric circuits, and a packaging process to separate semiconductor substrates into individual semiconductor chips and to seal each of the semiconductor chips with an epoxy resin.

The conventional FAB process includes a deposition process to form a thin layer on a semiconductor substrate; a chemical mechanical polishing (CMP) process to polish the thin layer; a photolithography process to form a photoresist pattern on the thin layer; an etching process to etch the thin layer into electrical patterns using the photoresist pattern as a mask; an ion implantation process to implant ions into regions of the semiconductor substrate; a cleaning process to clean impurities from the semiconductor substrate; a drying process to dry the cleaned wafer; and an inspection process to inspect for defects in the thin layer or patterns on the surface of the semiconductor substrate.

The photolithography process in further detail includes a coating process to coat a photoresist layer on a silicon wafer; a baking process to harden the photoresist layer into a photoresist film; an exposing process to transfer a pattern on a reticle (reticle pattern) to the photoresist film; and a developing process to form the photoresist pattern.

Referring to FIG. 4, conventionally an exposure system 10 includes an illuminating light source 12, an illuminating unit 14 to illuminate a reticle R with the illuminating light, a reticle stage 16 to support reticle R, an optical projection system 18 to project the illuminating light passing through reticle R onto a silicon wafer W, a wafer stage 20 to support the wafer W, a main column 22 to support reticle stage 16 and optical projection system 18, and a supporting bed 24 to support wafer stage 20.

An eximer laser may be used as illuminating light source 12. For example, the eximer laser may be an krypton fluoride (KrF) laser, which emits a laser beam having a wavelength of 248 nm; an argon fluoride (ArF) laser, which emits a laser beam having a wavelength of 193 nm; and a fluorine (F2) laser, which emits a fluorine laser beam having a wavelength of 157 nm.

Light source 12 is connected with illuminating unit 14 through a beam matching unit 26. An illuminating system housing 14A seals illuminating unit 14, a variable beam attenuator 14B, a beam shaping optical system 14C, a first fly-eye lens system 14D, a vibrating mirror 14E, a condenser lens 14F, a first mirror 14G, a second fly-eye lens system 14H, an aperture stop plate 14J, a beam splitter 14K, a first relay lens 14L, a reticle blind mechanism 14M, a second relay lens 14N, a second mirror 14P, and a main condenser lens system 14Q.

Reticle stage 16 is disposed on a reticle base supporting bed secured on main column 22 in a horizontal direction, and moves horizontally to transfer reticle patterns formed on a surface of reticle R onto wafer W. In addition, wafer stage 20 moves in an opposite direction to reticle stage 16, to allow the illuminating light passing through reticle R to irradiate onto wafer W during the exposing process.

Conventional exposure systems are disclosed in U.S. Pat. Nos. 6,331,885 and 6,538,719.

Over time, a photochemical reaction between the illuminating light and residual contamination on the surface of the reticle or minute contamination in the air produces a haze, i.e., contamination, on the surface of the reticle. Examples of the haze include a surface molecular contamination (SMC), ammonium sulfate, etc. The haze reduces transmission of the illuminating light through the reticle, which in turn can cause critical dimension (CD) failures and bridge failures.

SUMMARY OF THE INVENTION

According to an aspect of the present invention a method for managing a photolithography process by transmitting illuminating light through a reticle to expose a plurality of shot areas of a semiconductor substrate, calculating an accumulated dosage of the illuminating light irradiated on the plurality shot areas of the semiconductor substrate, comparing the calculated accumulated dosage with a reference dosage, and suspending the photolithography process if the calculated accumulated dosage is greater than or equal to the reference dosage.

In another method of the present invention a method of managing a photolithography process by exposing through a reticle a photoresist layer on a semiconductor substrate with an illuminating light, calculating an accumulated dosage of the illuminating light irradiated on one shot area on the semiconductor substrate, comparing the calculated accumulated dosage with a reference dosage, and suspending the photolithography process if the calculated accumulated dosage is greater than or equal to the reference dosage.

The present invention also discloses a photolithography system having an exposing apparatus which illuminates light through a reticle to expose a photoresist layer on a semiconductor substrate, a main controller connected to the exposing apparatus to control a dosage of the illuminating light, and a photolithography management unit connect to the main controller. The photolithography management unit having a calculator to calculate an accumulated dosage irradiated by the illuminating light, a data storing unit to store a reference dosage and the calculated accumulated dosage, a comparator to compare the calculated accumulated dosage with the reference dosage, and a management controller to suspend the photolithography process if the calculated accumulated dosage is greater than or equal to the reference dosage.

BRIEF DESCRIPTION OF THE DRAWINGS

The above aspects of the present invention will become apparent by reference to the following detailed description in conjunction with the accompanying drawings, in which.

DESCRIPTION OF THE EMBODIMENTS

The present invention will now be described with reference to the accompanying drawings in which exemplary embodiments of the present invention are shown.

Figure 1:
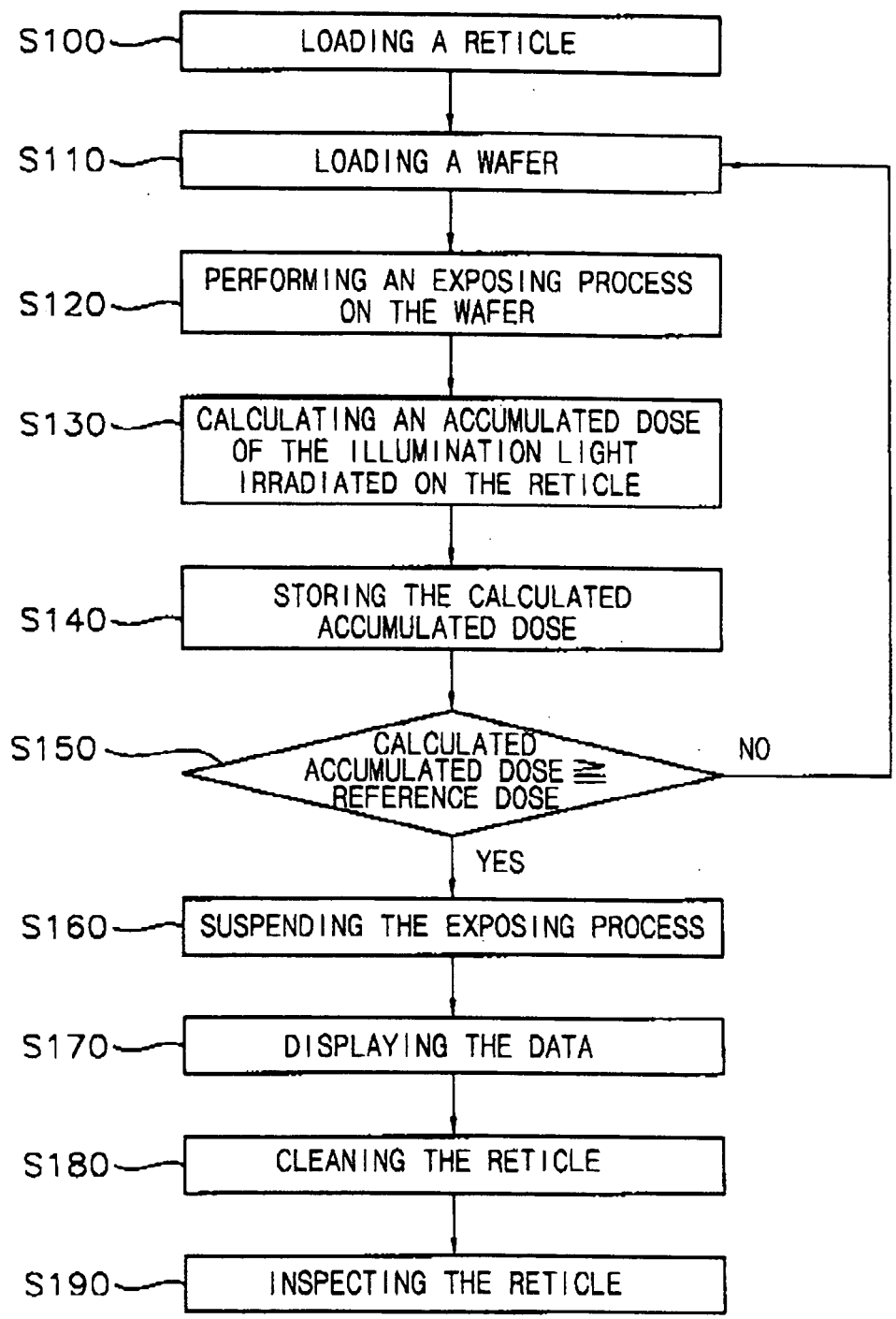
FIG. 1 is a flow chart showing a method for managing a photolithrgaphy process according to an embodiment of the present invention.
Figure 2:
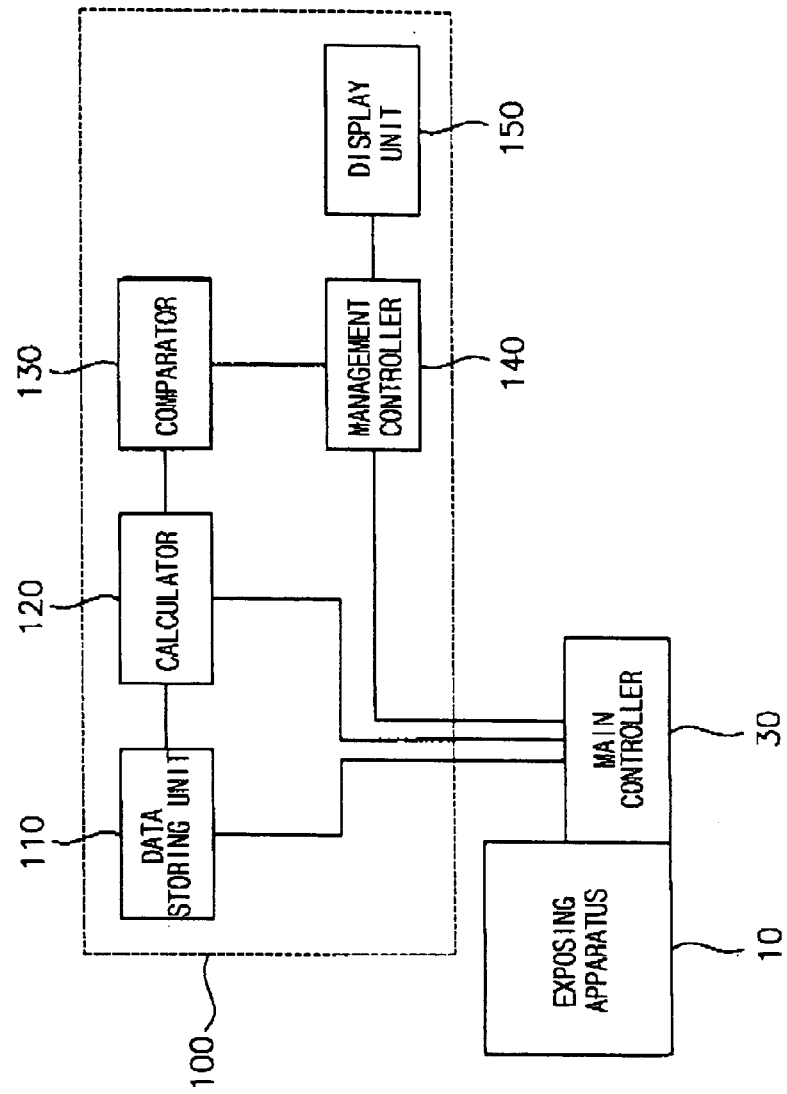
FIG. 2 is a block diagram showing a system for monitoring a photography system for performing the managing method shown in FIG. 1.
Figure 3:
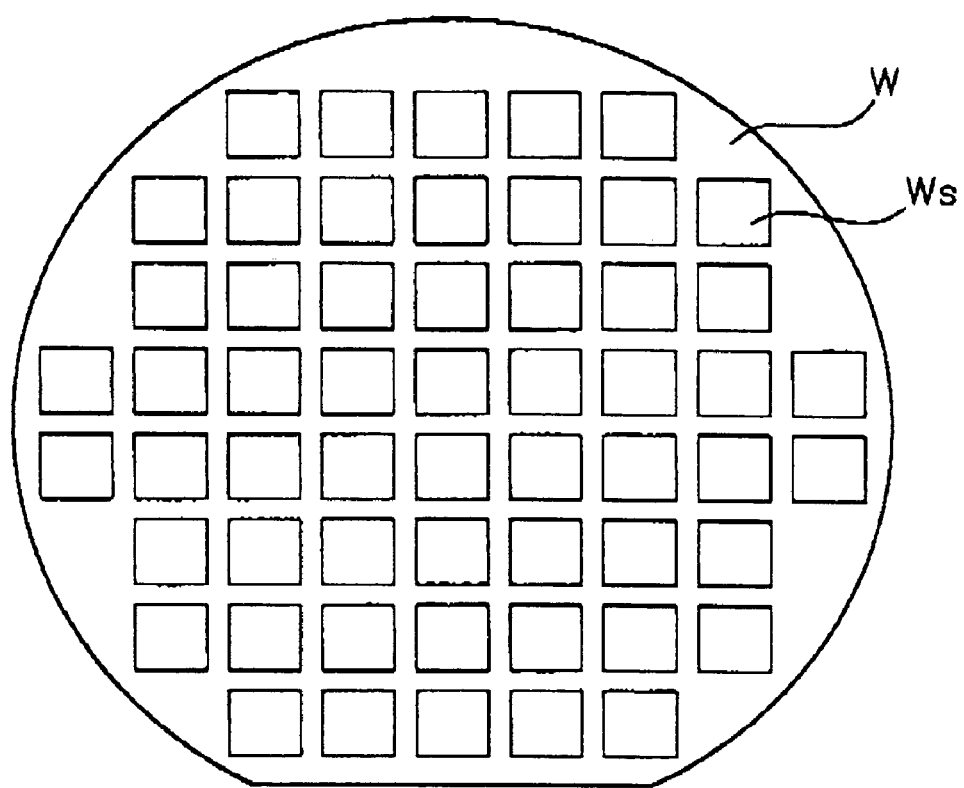
FIG. 3 is a plan view illustrating a conventional semiconductor substrate.
Figure 4:
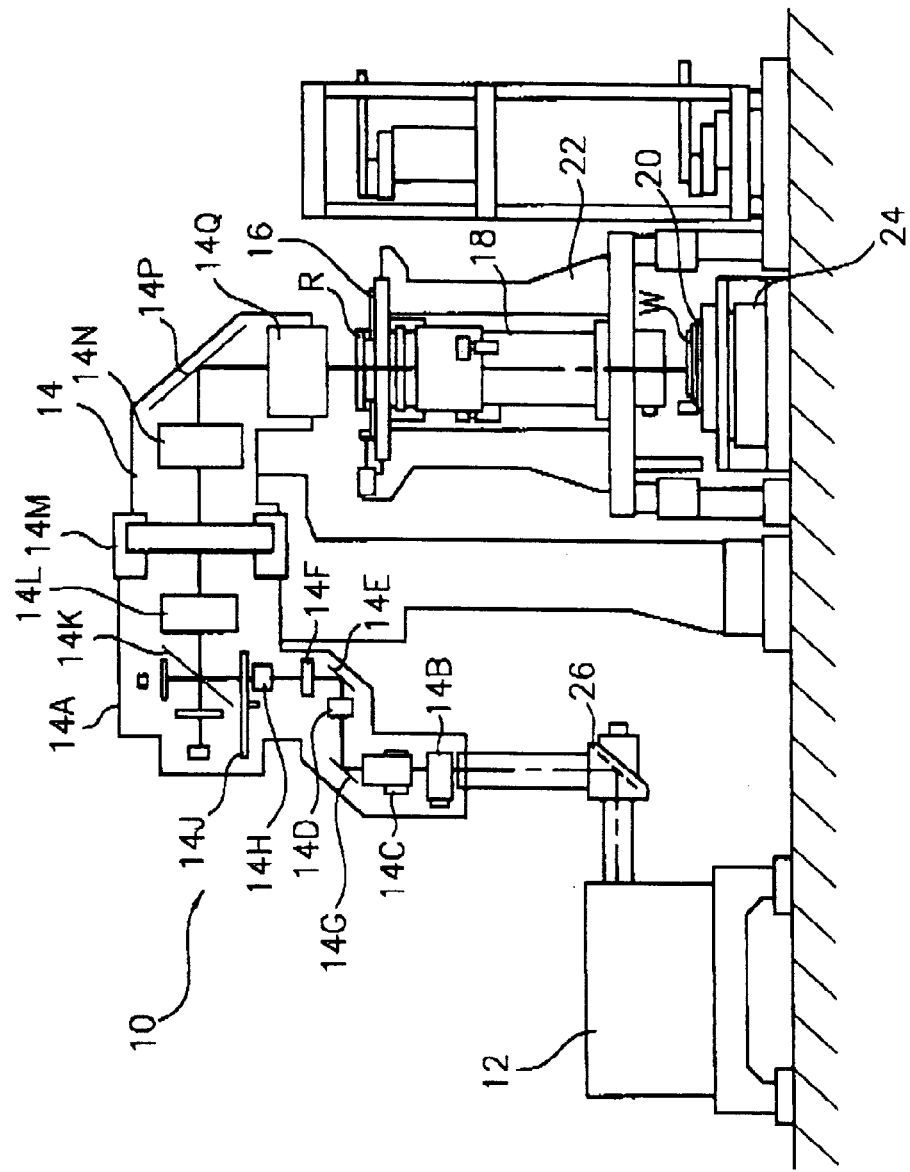
FIG. 4 is a structural view schematically illustrating a conventional exposing apparatus.

FIG. 1 is a flow chart to illustrate a method for monitoring a photolithography process according to an exemplary embodiment of the present invention. FIG. 2 is a block diagram of a photolithography management system of the present invention. FIG. 3 is a plan view illustrating a conventional semiconductor substrate. FIG. 4 is a structural view schematically illustrating a conventional exposure apparatus.

As illustrated in FIG. 3, a plurality of shot areas Ws are defined on a wafer W. The number of shot areas Ws is determined in accordance with a type of semiconductor device.

In FIG. 2, a photolithography management system 100 is connected to a main controller 30, which is connected to an exposing apparatus 10. Main controller 30 controls exposing apparatus 10 to sequentially perform an exposing process on wafers W in accordance with a preset recipe. The preset recipe contains the position and number of shot areas Ws defined on wafer W, an exposing time to expose each shot area, and an amount of energy of an illuminating light irradiated onto a reticle R during the exposing process with respect to each shot area. The preset recipe is stored into a data storing unit 110.

Photolithography management system 100 includes a calculator 120 connected to main controller 30, a comparator 130 connected to calculator 120, and a management controller 140 connected to main controller 30 and comparator 130.

In detail, calculator 120 calculates the accumulated dosage of the illuminating light irradiated on reticle R using data stored in data storing unit 110 and the dosage irradiated on reticle R by main controller 30. The accumulated dosage is the total energy of the illuminating light irradiated onto reticle R during an exposing process with respect to a plurality of shot areas Ws.

As an exemplary embodiment, the accumulated dosage D is calculated in accordance with the following equation (1):

$$D = E \times Sr \times Nw$$

D is the accumulated dosage in (mJ/cm$^2$) of an illuminating light; E is an amount of energy (mJ/cm$^2$) of the illuminating light irradiated onto a reticle R during an exposing process with respect to one shot area Ws defined on a wafer W; Sr is the number of the shot areas Ws on the wafer W; and, Nw is the number of wafers W on which a reticle R was used during an exposing process.

Main controller 30 controls an exposing process in accordance with a recipe stored in data storing unit 110. The current state of the exposing process is stored in data storing unit 110, and the data from data storing unit 110 is transferred to calculator 120 for calculation.

Comparator 130 compares the accumulated dosage calculated by calculator 120 against a preset reference dosage stored in data storing unit 110. If the calculated accumulated dosage is greater than or equal to the reference dosage, management controller 140 suspends the exposing process.

Hereinafter, a method for managing the photolithography process will be described in detail in regards to equation (1) and FIGS. 1–4.

A reticle R is loaded on a reticle stage 16 (step S100). A wafer W is loaded on a wafer stage 20 (step S110). The number of wafers W supported on wafer stage 20 is stored into a data storing unit 110.

A main controller 30 controls an exposing apparatus 10 to sequentially expose shot areas Ws defined on a wafer W with an illuminating light in accordance with a recipe stored in data storing unit 110 (step S120).

After the exposing process is completed, a calculator 120 calculates the accumulated dosage in accordance with equation (1) (step S130). Then the calculated accumulated dosage is stored in data storing unit 110 (step S140). A comparator 130 compares the calculated accumulated dosage with a reference dosage stored in data storing unit 110 (step S150).

If the calculated accumulated dosage is less than the reference dosage, another wafer W is loaded, and the exposing process is continued. The data is loaded to data storing unit 110. However, management controller 140 suspends the exposing process if the calculated accumulated dosage is greater than or equal to the reference dosage (step S160). If the exposing process is suspended, a haze contamination has probably accumulated on the surface of reticle R.

A display unit 150 displays the calculated accumulated dosage, the reference dosage, and the difference between the calculated accumulated dosage and the reference dosage (step S170). A cleaning process is performed on reticle R (step S180), and then an inspection process is performed on the cleaned reticle R (step S190). An illuminating light transmission inspection is made on the cleaned reticle R. An inspection of pattern failures on reticle R is also made during the inspection process. The above data is also stored in data storing unit 110.

According to the present invention, reticle R is prevented in advance from developing a haze contamination. That is, through the system and method of the present invention, reticle R is cleaned before the haze contamination is formed.

Figure 5:
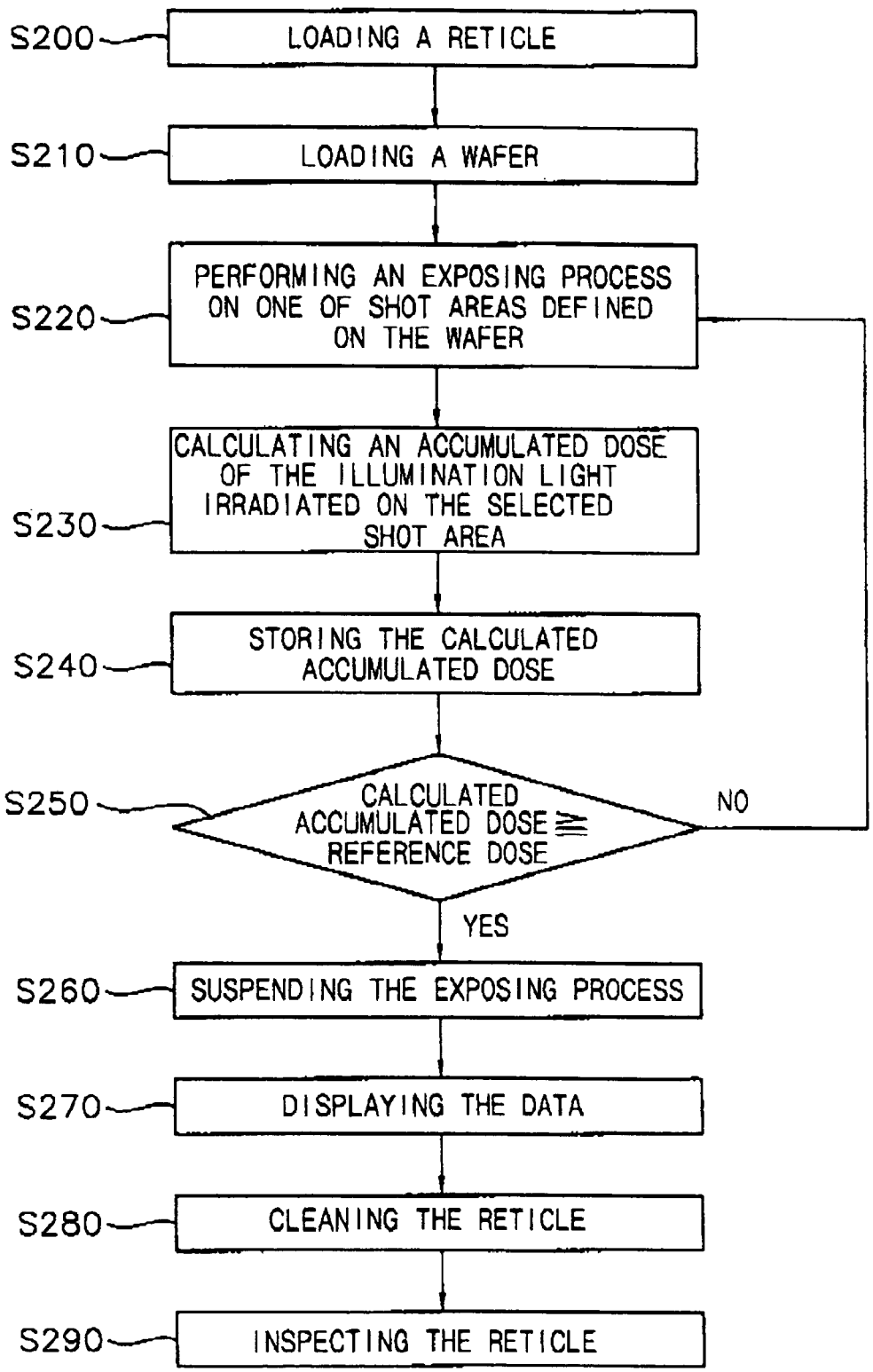
FIG. 5 is a flow chart for showing a method of managing a reticle according to another exemplary embodiment of the present invention.

FIG. 5 is a flow chart to illustrate a method of managing a photolithography process according to another exemplary embodiment of the present invention.

Referring to FIGS. 2 through 5, the accumulated dosage is calculated by the following equation (2):

$$D = E \times St$$

D is the accumulated dosage (mJ/cm$^2$) of an illuminating light; E is an amount of energy (mJ/cm$^2$) of the illuminating light irradiated onto a reticle R during an exposing process with respect to one shot area Ws defined on a wafer W; and St is the number of shot areas for which rectile R has been used.

Hereinafter, a method for managing the photolithography process will be described in regards to equation (2).

A reticle R is loaded on a reticle stage 16 (step S200). A wafer W is also loaded on a wafer stage 20 (step S210).

A main controller 30 selects one shot area W defined on a wafer W in accordance with a recipe stored in a data storing unit 110, and then controls an exposing apparatus 10 to expose the selected shot area W with an illuminating light (step S220) using reticle R.

After the exposing process on the selected shot area W is completed, a calculator 120 calculates the accumulated dosage in accordance with equation (2) (step S230). The calculated accumulated dosage is stored in data storing unit 110 (step S240), and a comparator 130 compares the calculated accumulated dosage with a reference dosage stored in data storing unit 110 (step S250).

If the calculated accumulated dosage is less than the reference dosage, another wafer W is loaded, and the exposing process is continued. The data is loaded to data storing unit 110. However, management controller 140 suspends the exposing process if the calculated accumulated dosage is greater than or equal to the reference dosage (step S260). If the exposing process is suspended, a haze contamination has probably accumulated on the surface of reticle R.

A display unit 150 displays the calculated accumulated dosage, the reference dosage, and the dosage difference between the calculated accumulated dosage and the reference dosage (step S270). A cleaning process is performed on reticle R (step S280), and then an inspection process is performed on the cleaned reticle (step S290).

According to the management method of a photolithography process in accordance with equation (1), an accumulated dosage is calculated after all shot areas Ws are exposed, and thereafter, a reticle R is managed in accordance with the calculated accumulated dosage. In contrast, according to the management method of a photolithography process in accordance with equation (2), the accumulated dosage is calculated each time an exposing process is completed on one shot area (Ws), and accordingly, a reticle R is managed in accordance with the calculated accumulated dosage. In other words, the management method in accordance with equation (1) is performed every time the exposing process is completed with respect one wafer W, whereas the management method in accordance with equation (2) is performed each time one shot area W is exposed to an illuminating light through reticle R.

Therefore, the management photolithography process improves the throughput of the wafers in the exposing process. Process failure of the photoresist patterns due to the haze contamination is prevented.

Although the exemplary embodiments of the present invention have been described, it is understood that the present invention should not be limited to these exemplary embodiments but various changes and modifications can be made by one skilled in the art within the scope of the present invention as hereinafter claimed.

What is claimed is:

1. A method for managing a photolithography process, comprising:
   transmitting illuminating light through a reticle to expose a plurality of shot areas of a semiconductor substrate;
   calculating an accumulated dosage of the illuminating light irradiated on the plurality shot areas of the semiconductor substrate;
   comparing the calculated accumulated dosage with a reference dosage; and
   suspending the photolithography process if the calculated accumulated dosage is greater than or equal to the reference dosage,
   wherein the accumulated dosage D is determined in accordance with the following equation:

$$D = E \times Sr \times Nw$$

wherein, E is an amount of energy of the illuminating light irradiated onto the reticle with respect to one shot area on the semiconductor substrate, Sr is a number of shot areas on the semiconductor substrate, and Nw is a number of semiconductor substrates for which the reticle has been used in the exposing process.

2. The method of claim 1, further comprising storing the calculated accumulated dosage and the reference dosage in a data storing unit.

3. The method of claim 1, further comprising displaying the calculated accumulated dosage, the reference dosage, and difference between the calculated accumulated dosage and the reference dosage on a displayer.

4. A method for managing a photolithography process, comprising:
   transmitting illuminating light through a reticle to expose a plurality of shot areas of a semiconductor substrate;
   calculating an accumulated dosage of the illuminating light irradiated on the plurality shot areas of the semiconductor substrate;
   comparing the calculated accumulated dosage with a reference dosage;
   suspending the photolithography process if the calculated accumulated dosage is greater than or equal to the reference dosage; and
   cleaning the reticle after suspending the photolithography process.

5. A method of managing a photolithography process, comprising:
   exposing through a reticle a photoresist layer on a semiconductor substrate with an illuminating light;
   calculating an accumulated dosage of the illuminating light irradiated on one shot area on the semiconductor substrate;
   comparing the calculated accumulated dosage with a reference dosage; and
   suspending the photolithography process if the calculated accumulated dosage is greater than or equal to the reference dosage,
   wherein the accumulated dosage D is determined in accordance with the following equation:

$$D = E \times St$$

wherein, E is an amount of energy of the light irradiated onto the reticle in the exposing process with respect to one shot area on the semiconductor substrate, and St is the number of shot areas for which the rectile R has been used.

6. The method of claim 5, wherein the accumulated dosage D is calculated each time another shot area is exposed to the illuminating light.

7. The method of claim 5, further comprising storing the calculated accumulated dosage and the reference dosage data in a data storing unit.

8. The method of claim 5, further comprising displaying the calculated accumulated dosage, the reference dosage, and the difference between the calculated accumulated dosage and the reference dosage in a displayer.

9. A method of managing a photolithography process, comprising:
   exposing through a reticle a photoresist layer on a semiconductor substrate with an illuminating light;
   calculating an accumulated dosage of the illuminating light irradiated on one shot area on the semiconductor substrate;
   comparing the calculated accumulated dosage with a reference dosage; and
   suspending the photolithography process if the calculated accumulated dosage is greater than or equal to the reference dosage; and
   cleaning the reticle after suspending the exposing process.

10. A photolithography system, comprising:
an exposing apparatus which illuminates light through a reticle to expose a photoresist layer on a semiconductor substrate;
a main controller connected to the exposing apparatus to control a dosage of the illuminating light;
a photolithography management unit connect to the main controller, wherein the photolithography management unit comprises;
a calculator to calculate an accumulated dosage D irradiated by the illuminating light;
a data storing unit to store. a reference dosage and the calculated accumulated dosage;
a comparator to compare the calculated accumulated dosage with the reference dosage; and
a management controller to suspend the photolithography process if the calculated accumulated dosage is greater than or equal to the reference dosage,
wherein the accumulated dosage D is determined in accordance with the following equation:

$$D = E \times Sr \times Nw$$

wherein, E is an amount of energy of the illuminating light irradiated onto the reticle by the exposing apparatus during an exposing process with respect to one shot area on the semiconductor substrate, Sr is a number of the shot area on the semiconductor substrate, and Nw is a number of semiconductor substrate the reticle has been used in the exposing process.

11. The system of claim 10, wherein the accumulated dosage D is determined when the exposing process is complete on all shot areas of the semiconductor substrate.

12. A photolithography system, comprising:
an exposing apparatus which illuminates light through a reticle to expose a photoresist layer on a semiconductor substrate;
a main controller connected to the exposing apparatus to control a dosage of the illuminating light;
a photolithography management unit connect to the main controller, wherein the photolithography management unit comprises:
a calculator to calculate an accumulated dosage D irradiated by the illuminating light;
a data storing unit to store a reference dosage and the calculated accumulated dosage;
a comparator to compare the calculated accumulated dosage with the reference dosage; and
a management controller to suspend the photolithography process if the calculated accumulated dosage is greater than or equal to the reference dosage,
wherein the accumulated dosage D is accordance with the following equation:

$$D = E \times St$$

wherein, E is an amount of energy of the light irradiated onto the reticle in the exposing process with respect to a one shot area on the semiconductor substrate, and St is the number of shot areas for which the rectile R has been used.

13. The method of claim 12, wherein the accumulated dosage D is determined each time a shot area is exposed on the semiconductor substrate.

14. The system of claim 10, wherein the photolithography management unit further comprises a display unit for displaying the calculated accumulated dosage, the reference dosage, and the difference between the calculated accumulated dosage and reference dosage.

15. The system of claim 12, wherein the photolithography management unit further comprises a display unit for displaying the calculated accumulated dosage, the reference dosage, and the difference between the calculated accumulated dosage and reference dosage.

* * * * *